(12) United States Patent
Palmer

(10) Patent No.: US 11,309,104 B2
(45) Date of Patent: Apr. 19, 2022

(54) SUPERCONDUCTING ELECTRICAL POWER DISTRIBUTION NETWORK

(71) Applicant: ROLLS-ROYCE plc, London (GB)

(72) Inventor: Chloe J. Palmer, Derby (GB)

(73) Assignee: Rolls-Royce PLC, London (GB)

( * ) Notice: Subject to any disclaimer, the term of this patent is extended or adjusted under 35 U.S.C. 154(b) by 334 days.

(21) Appl. No.: 16/734,480

(22) Filed: Jan. 6, 2020

(65) Prior Publication Data
US 2020/0243225 A1 Jul. 30, 2020

(30) Foreign Application Priority Data

Jan. 25, 2019 (GB) ...................................... 1901030

(51) Int. Cl.
H01B 12/16 (2006.01)
H02B 1/20 (2006.01)
H02J 3/38 (2006.01)
H05K 7/20 (2006.01)
H02B 1/56 (2006.01)

(52) U.S. Cl.
CPC ............ H01B 12/16 (2013.01); H02B 1/202 (2013.01); H02B 1/56 (2013.01); H02J 3/381 (2013.01); H05K 7/20927 (2013.01)

(58) Field of Classification Search
CPC .......... H01B 12/16; H02B 1/20; H02B 1/202; H02B 1/56; H02J 3/38; H02J 3/381; H05K 7/20927; H05K 7/20
See application file for complete search history.

(56) References Cited

U.S. PATENT DOCUMENTS

| 3,946,141 A | 3/1976 | Schmidt |
| 3,950,606 A | 4/1976 | Schmidt |
| 4,845,308 A | 7/1989 | Womack, Jr. et al. |
| 4,992,623 A | 2/1991 | Briley et al. |
| 6,342,673 B1 | 1/2002 | Verhaege et al. |

(Continued)

FOREIGN PATENT DOCUMENTS

| CA | 1016616 | 8/1977 |
| CN | 1161267 | 10/1997 |

(Continued)

OTHER PUBLICATIONS

Response to Extended European Search Report from EP Application No. 20150774.6 dated Jun. 9, 2020, filed Jan. 5, 2021, 36 pgs.

(Continued)

Primary Examiner — Robert L Deberadinis
(74) Attorney, Agent, or Firm — Shumaker & Sieffert, P.A.

(57) ABSTRACT

A superconducting electrical power distribution network has a superconducting bus bar and superconducting cables electrically connected to the bus bar at respective joints distributed along the bus bar. The network further has a first coolant system for providing first cryogenic fluid and first circuits for circulating the first cryogenic fluid provided by the first coolant system. The first circuits comprise: a bus bar flow path which extends along and thereby cools the bus bar, cable flow paths which respectively extend along and thereby cool the cables, cooling junctions where the bus bar and cable flow paths meet at the electrical connection joints, inflow lines which send the first cryogenic fluid from the first coolant system to the flow paths, and outflow lines which remove the first cryogenic fluid from the flow paths.

13 Claims, 7 Drawing Sheets

(56) References Cited

U.S. PATENT DOCUMENTS

| | | |
|---|---|---|
| 6,472,791 B1 | 10/2002 | Rehder et al. |
| 6,864,417 B2 | 3/2005 | Bechis et al. |
| 8,280,467 B2 | 10/2012 | Yuan et al. |
| 8,896,312 B2 | 11/2014 | Stauffenegger et al. |
| 9,378,870 B2 | 6/2016 | Lakrimi et al. |
| 10,485,145 B2 | 11/2019 | Cullen |
| 2006/0040584 A1 | 2/2006 | Ray et al. |
| 2006/0116292 A1 | 6/2006 | Kato et al. |
| 2006/0283620 A1 | 12/2006 | Maguire et al. |
| 2008/0190637 A1 | 8/2008 | Folts et al. |
| 2012/0186854 A1 | 7/2012 | Choi et al. |
| 2013/0090245 A1 | 4/2013 | Simpkins |
| 2016/0003341 A1 | 1/2016 | Sieveking et al. |
| 2016/0049225 A1 | 2/2016 | McIntyre et al. |
| 2018/0169819 A1 | 6/2018 | Junker |
| 2020/0244130 A1 | 7/2020 | Palmer |

FOREIGN PATENT DOCUMENTS

| | | |
|---|---|---|
| CN | 107470871 | 12/2017 |
| EP | 0395314 | 10/1990 |
| WO | 2008051234 | 5/2008 |
| WO | 2008113366 | 9/2008 |

OTHER PUBLICATIONS

Ex Parte Quayle from U.S. Appl. No. 16/734,491, dated May 13, 2021, 5 pp.

European search report dated Apr. 23, 2020, issued in EP Patent Application No. 19205047.

European search report dated May 29, 2020, issued in EP patent application No. 20150771.

Great Britain search report dated Jul. 3, 2019, issued in GB Patent Application No. 1901030.5.

Great Britain search report dated Jun. 26, 2019, issued in GB Patent Application No. 1901032.1.

Notice of Allowance from U.S. Appl. No. 16/734,491, dated Aug. 3, 2021, 8 pp.

Response to Ex Parte Qualye dated May 13, 2021, from U.S. Appl. No. 16/734,491, filed Jul. 13, 2021, 6 pp.

European search report dated May 29, 2020, issued in EP Patent Application No. 20150774.

SUPERCONDUCTING ELECTRICAL POWER DISTRIBUTION NETWORK

CROSS-REFERENCE TO RELATED APPLICATIONS

This specification is based upon and claims the benefit of priority from UK Patent Application Number 1901030.5 filed on 25 Jan. 2019, the entire contents of which are incorporated herein by reference.

BACKGROUND

Technical Field

The present disclosure relates to a superconducting electrical power distribution network.

Description of the Related Art

The use of electrical machines for aerospace propulsion is known. However, conventional electrical machines generally have insufficient specific torque and power densities (whether measured in terms of weight or volume) to make the concept viable compared to conventional aerospace propulsion technologies for large aircraft.

Superconducting electrical machines have the potential for making substantial gains in specific torque and power densities. An attraction of using superconducting technology in electrical motors and generators is that they can operate at higher magnetic fields and currents than are possible in conventional electrical machines. This means that significantly more torque and power can be produced for a given machine volume, increasing the torque and power volume densities to levels that are needed for electrical propulsion in large aircraft applications. The near-zero electrical resistances also cause very low losses. This is also an advantage in power distribution networks used to transfer electrical power between machines (e.g. between generators and motors).

However, the cryogenic cooling systems needed to maintain superconductivity within machines and across power distribution networks are energy intensive, complex and incur a significant weight penalty. They are a significant factor in restricting more widespread adoption of superconducting technology. Network cooling, in particular, can be problematic because of heat production at electrical connections between superconductors or between a superconductor and a non-superconductor.

Coolant and coolant systems thus play a key role in the overall viability of a superconducting concept. However, conventionally, the cooling requirements of components of power distribution networks are treated separately, with little regard to cooling priorities and synergies to be obtained by sharing cooling circuits. In contrast, the present disclosure, as well as addressing the problem of heat production at electrical connections, benefits from a more holistic approach to the determination of suitable configurations of cooling systems for superconducting electrical power distribution networks.

SUMMARY

According to a first aspect there is provided a superconducting electrical power distribution network comprising:
a superconducting bus bar;
superconducting cables electrically connected to the bus bar at respective joints distributed along the bus bar;
a first coolant system for providing first cryogenic fluid; and,
first circuits for circulating the first cryogenic fluid provided by the first coolant system; wherein,
the first circuits comprise: a bus bar flow path which extends along and thereby cools the bus bar, cable flow paths which respectively extend along and thereby cool the cables, cooling junctions where the bus bar and cable flow paths meet at the electrical connection joints, inflow lines which send the first cryogenic fluid from the first coolant system to the flow paths, and outflow lines which remove the first cryogenic fluid from the flow paths; and,
each cooling junction is connected to a respective one of the outflow lines and is configured such that the first cryogenic fluid arrives at that cooling junction from the flow paths which meet thereat and departs that cooling junction into the respective outflow line for return to the first coolant system.

The first circuits of the first aspect may further comprise a respective further junction on the bus bar flow path between the or each pair of adjacent cooling junctions, the or each further junction being connected to a respective one of the inflow lines and being configured such that the first cryogenic fluid arrives at that further junction from the respective inflow line and departs that further junction by flow in opposite directions along the bus bar flow path to the adjacent cooling junctions.

In the first aspect, each cable flow path may comprise an end which may be distal from the bus bar flow path and which may be connected to a respective one of the inflow lines.

According to a second aspect there is provided a superconducting electrical power distribution network comprising:
a superconducting bus bar;
superconducting cables electrically connected to the bus bar at respective joints distributed along the bus bar;
a first coolant system for providing first cryogenic fluid; and,
first circuits for circulating the first cryogenic fluid provided by the first coolant system; wherein,
the first circuits comprise: a bus bar flow path which extends along and thereby cools the bus bar, cable flow paths which respectively extend along and thereby cool the cables, cooling junctions where the bus bar and cable flow paths meet at the electrical connection joints, inflow lines which send the first cryogenic fluid from the first coolant system to the flow paths, and outflow lines which remove the first cryogenic fluid from the flow paths; and,
each cooling junction is connected to a respective one of the inflow lines and is configured such that the first cryogenic fluid sent from the first coolant system arrives at that cooling junction from the respective inflow line and departs that cooling junction into the flow paths which meet thereat.

The first circuits of the second aspect may further comprise a respective further junction on the bus bar flow path between the or each pair of adjacent cooling junctions, the or each further junction being connected to a respective one of the outflow lines and being configured such that the first cryogenic fluid arrives at that further junction by flow in opposite directions along the bus bar flow path from the adjacent cooling junctions and departs that further junction into the respective outflow line.

In the second aspect, each cable flow path may comprise an end which is distal from the bus bar flow path and which is connected to a respective one of the outflow lines.

The first coolant system of the second aspect may be similar to that of the first aspect except that flow through the cooling junctions may be reversed, i.e. in the first aspect the first cryogenic fluid departs the cooling junction into respective outflow lines, and in the second aspect the first cryogenic fluid arrives at the cooling junction from respective inflow lines.

Advantageously, in both the first and second aspects, the cooling junctions may allow overall mass flows through the junctions to be high (e.g. relative to the individual mass flows along the bus bar and cable flow paths) so that cooling times at the junctions are reduced, and the likelihood of quenching at the electrical connection joints may also be reduced. If a quench fault does happen, the response cool down time may be reduced allowing the network to recover rapidly. In addition, the cooling junctions are consistent with giving a higher cooling priority to the electrical connection joints than to the bus bar and cables.

According to a third aspect there is provided an aeropropulsion system or marine propulsion system comprising a superconducting electrical power distribution network according to the first or second aspect.

Further optional features of the present disclosure will now be set out. These are applicable singly or in any combination with any aspect of the present disclosure.

The first cryogenic fluid may be helium or hydrogen.

The first coolant system may comprise one or more first heat exchange units for effecting heat transfer from the first cryogenic fluid to another fluid, the outflow lines returning the first cryogenic fluid removed from the flow paths back to the first heat exchange units for re-cooling and recirculation.

The superconducting electrical power distribution network may further comprise: (i) one or more superconducting electrical power generators, the or each power generator providing electrical power to the bus bar via a respective one of the cables; and/or (ii) one or more superconducting electrical motors, the or each motor receiving electrical power from the bus bar via a respective one of the cables. In this case the superconducting electrical power distribution network may further comprise: a second coolant system for cooling second cryogenic fluid; and one or more second circuits for circulating the second cryogenic fluid from the second coolant system, to (i) the power generators and/or (ii) the motors, and back to the second coolant system for re-cooling and recirculation. The second coolant system may comprises one or more second heat exchange units for effecting heat transfer from the second cryogenic fluid to the first cryogenic fluid. Thermally connecting the first and the second coolant systems in this way can help to reduce the overall number of heat exchangers and is consistent with giving the cooling of the generators and/or motors a relatively high priority level.

The superconducting electrical power distribution network may further comprise one or more gas turbine engines which respectively power the power generators.

The superconducting electrical power distribution network may further comprise one or more fans or propellers which are respectively powered by the electrical motors. For example, the network may be part of an aero-propulsion system, and the fans or propellers may be propulsive fans or propellers. For another example, the network may be part of a marine propulsion system, and the propellers may be propulsive propellers.

The second cryogenic fluid may be helium.

When the superconducting electrical power distribution network has (i) the power generators, the power generators may be AC power generators, and the bus bar and cables may carry DC electrical power. In addition, between the or each power generator and the cable via which its electrical power may be provided to the bus bar, the power distribution network may further comprise a respective semiconductor-based rectifier which rectifies the AC electrical power generated by the power generator into DC electrical power. Conveniently, the outflow lines may then provide the first cryogenic fluid removed from the flow paths to the or each rectifier for cooling thereby.

Additionally or alternatively, when the superconducting electrical power distribution network has (i) the power generators, the network may further comprise one or more gas turbine engines which respectively power the one or more power generators, the or each gas turbine engine comprising a respective intercooler for reducing the temperature of compressed air between compressor stages of the engine. Conveniently, the outflow lines may then provide the first cryogenic fluid removed from the flow paths to the or each intercooler for effecting heat transfer from the compressed air to the first cryogenic fluid.

When the superconducting electrical power distribution network has (ii) the electrical motors, the electrical motors may be AC electrical motors, and the bus bar and cables may carry DC electrical power. In addition, between the or each electrical motor and the cable via which its electrical power may be received from the bus bar, the power distribution network may further comprise a respective semiconductor-based inverter which inverts the DC electrical power received from the bus bar into AC electrical power. Conveniently, the outflow lines may then provide the first cryogenic fluid removed from the flow paths to the or each inverter for cooling thereby.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

DESCRIPTION OF THE DRAWINGS

Embodiments will now be described by way of example only, with reference to the Figures, in which.

DETAILED DESCRIPTION

Figure 1:
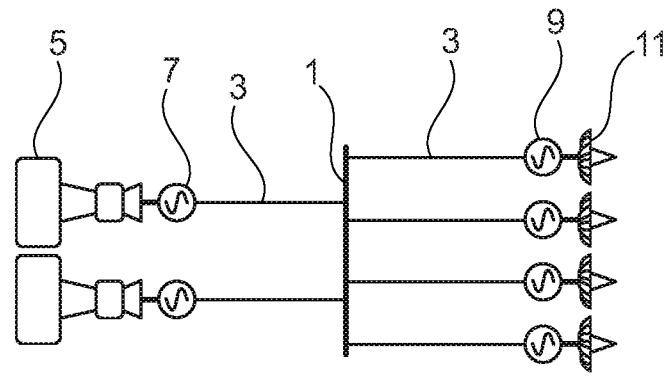
FIG. 1 shows schematically an AC superconducting electrical power distribution network.

FIG. 1 shows schematically an AC superconducting electrical power distribution network, e.g. for an aero-propulsion system. The network has a superconducting bus bar 1 and superconducting cables 3 which are electrically connected to the bus bar at respective joints distributed along the bus bar. Gas turbine engines 5 power respective superconducting AC power generators 7 which feed AC electrical power to the bus bar via respective ones of the cables. On the other side of the bus bar, superconducting electrical motors 9 draw AC electrical power from respective others of the cables and to power propulsive fans or propellers 11.

Figure 2:
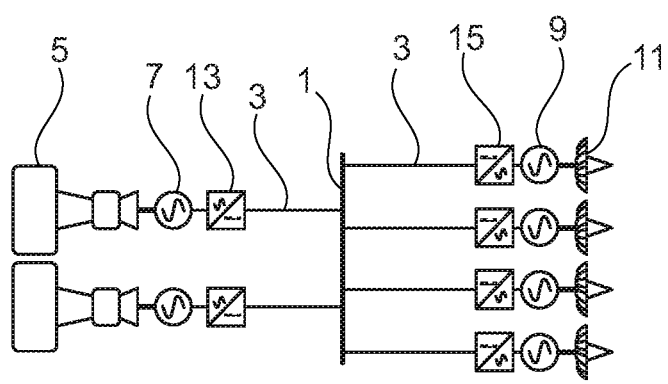
FIG. 2 shows schematically a DC superconducting electrical power distribution network.

FIG. 2 shows schematically a DC superconducting electrical power distribution network which is essentially identical to the AC network except for: semiconductor-based rectifiers 13 between the power generators 7 and their cables 3 which rectify the AC electrical power generated by the power generators into DC electrical power, and semiconductor-based inverters 15 between the electrical motors 9 and their cables 3 which invert the DC electrical power received from the bus bar 1 into AC electrical power.

Each component of the networks has different cooling requirements. The power generators 7 and electrical motors 9 require relatively low temperatures, and high coolant mass flows due to their high cooling loads. The bus bar 1 and cables 3 are less susceptible to sudden quench (due to higher thermal inertia-to-power density ratios) and consequently have less demanding cooling requirements.

Figure 3:
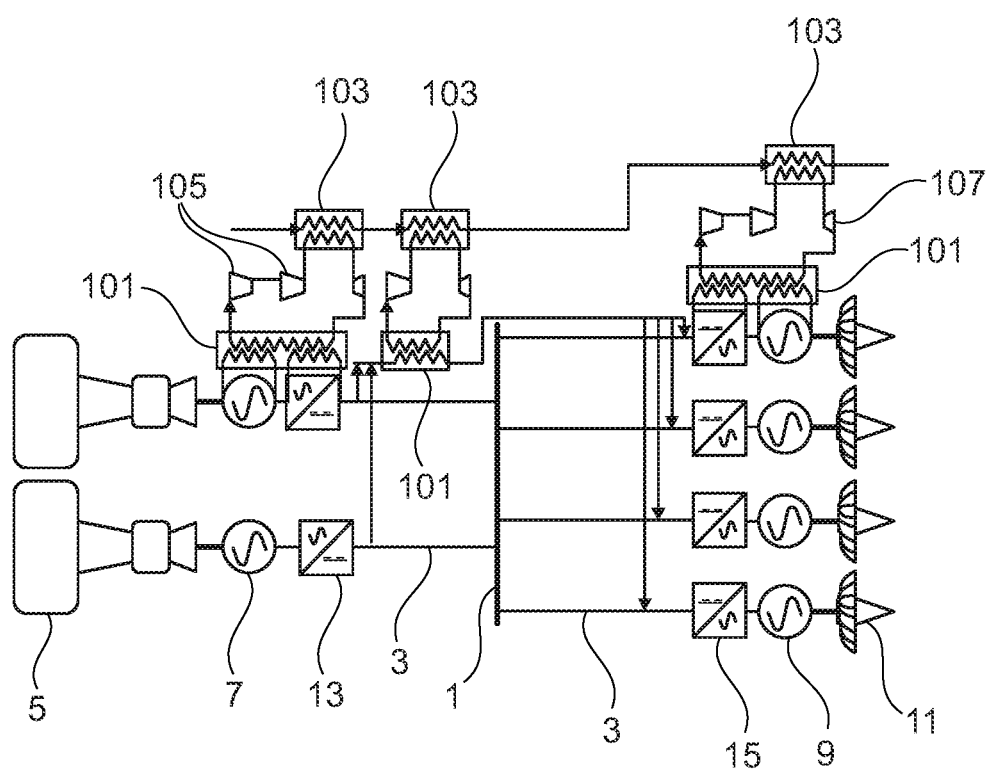
FIG. 3 shows the DC network of FIG. 2 comprising a cooling arrangement which is the result of applying conventional cryogenic cooling system design practice.

FIG. 3 shows a cooling arrangement which is the result of applying conventional cryogenic cooling system design practice to the network of FIG. 2. A similar cooling arrangement can be applied to the network of FIG. 1. A first coolant system comprises first circuits which circulate, for example, helium coolant around the superconducting power generators 7, electrical motors 9, bus bar 1 and cables 3 and around the semiconductor power electronics 13, 15. In particular, the first circuits serving the bus bar and cables can include flow paths in the form of longitudinal channels (e.g. tubular jackets) along the bus bar and cables so that coolant enters the flow paths e.g. adjacent the inverters 15 and leaves adjacent the rectifiers 13. Arrowed lines indicate this direction of coolant flow around the first circuits serving the bus bar and cables.

The first coolant system also comprises first heat exchangers 101 which effect heat transfer from the helium coolant of the first circuits into a coolant of a second coolant system. In particular, the first circuits include outflow lines which transport the helium coolant from the components of the network to the heat exchangers, and inflow lines which return the re-cooled helium from the heat exchangers back to the components. The second coolant may also be helium. This is circulated by second circuits of the second coolant system around second heat exchangers 103 which effect heat transfer from the second coolant into a third coolant, such as liquefied natural gas (LNG). Conveniently, the second cooling circuits can include compressors 105 en route to the second heat exchangers and expanders 107 en route away from the second heat exchangers.

As shown in FIG. 3, a single first heat exchanger 101 serves the first circuit which circulates coolant around the bus bar 1 and cables 3. As also shown, a single first heat exchanger serves the first circuit for one pair of a power generator 7 and a rectifier 13, and another first heat exchanger serves the first circuit for one pair of a motor 9 and an inverter 15. Although not shown, further first heat exchangers serve first circuits for other such pairs.

A problem with this cooling arrangement is that it requires a relatively large number of heat exchangers. This results from the focus of conventional cryogenic cooling system design practice on individual components, which in turn leads to a failure to determine and prioritise cooling requirements at a network level. Thus conventional practice does not take into consideration relative operational temperatures of each component, e.g. that a higher temperature may be acceptable for cables than for motors, or likelihoods of local heating and quench. In particular, conventional practice can fail to recognise the significance of heat generation at the joints between components where at least one of those components is superconducting. In particular, the joints spaced along the bus bar 1 which electrically connect the bus bar to the cables 3 can generate significant heat and hence may require additional cooling.

Thus the present disclosure proposes a cryogenic cooling methodology that can lead to more optimum cooling systems. Mass flow and temperature are key factors in a fluid cooling system affecting overall power usage, as specific heat capacity can be considered relatively constant for a given coolant fluid. This means that consideration of coolant mass flow and temperature optimization of superconducting networks in different zones is important for achieving light and efficient cryogenic cooling systems.

Figure 4:
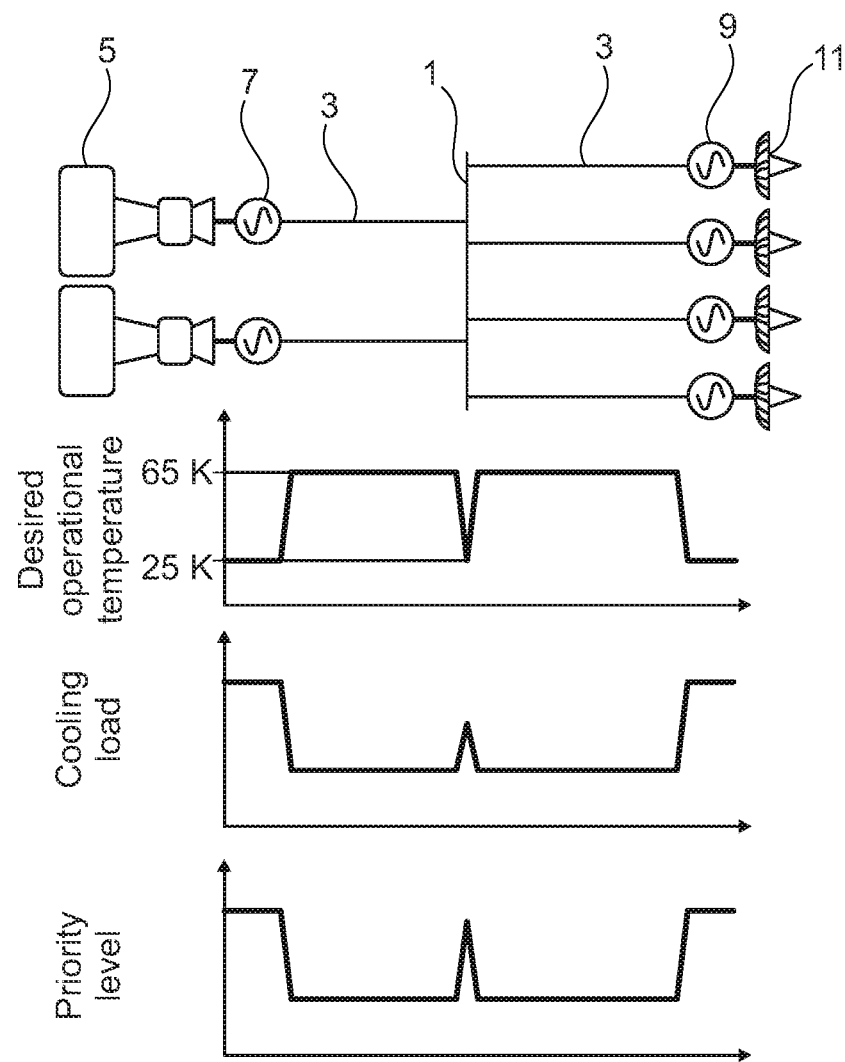
FIG. 4 shows at top the AC network of FIG. 1 and below schematic graphs of respectively desired operational temperature, cooling load and cooling priority level for the components of the network.

FIG. 4 shows at top the AC network of FIG. 1 and below schematic graphs of respectively desired operational temperature, cooling load (i.e. amount of heat rejected), and a resultant cooling priority level determined by dividing the cooling load by the desired temperature. The horizontal axis of each graph is location in the network, mapping onto the components of the network shown at top. Thus the power generators 7 and electrical motors 9 have relatively low operational temperatures and high cooling loads leading to high priority levels for these components. In contrast, the cables 3 are more efficient and are less susceptible to sudden quench, which is reflected in relatively high operational temperatures and low cooling loads leading to lower priority levels. However, the bus bar 1 also has a relatively low operational temperature and high cooling load leading to a high priority level because of the effect of heat generation at the joints with the cables.

Figure 5:
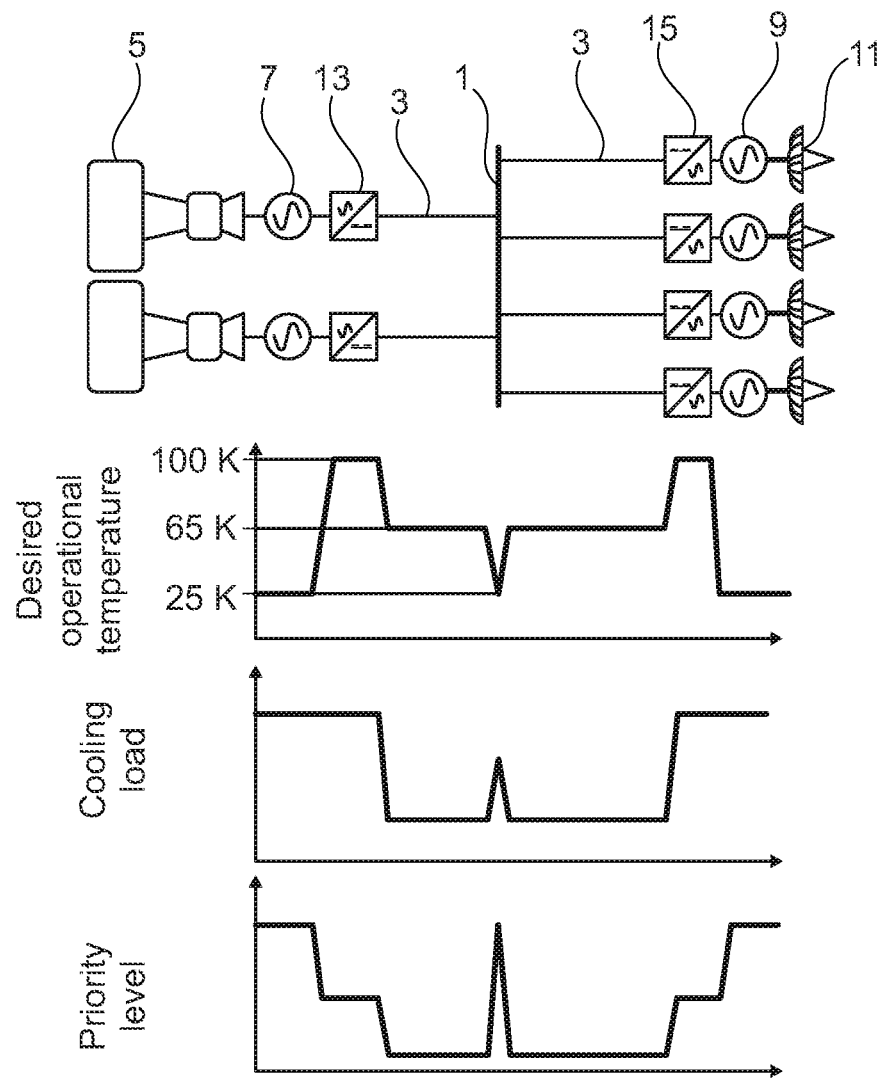
FIG. 5 shows at top the DC network of FIG. 2 and below schematic graphs of respectively desired operational temperature, cooling load and cooling priority level for the components of the network.

FIG. 5 shows the corresponding schematic graphs for the DC network of FIG. 2. The rectifier 13 and inverter 15 semiconductor power electronics operate at higher temperatures than the superconducting components of the network, but have similar cooling loads to the generators and motors, giving them a mid-level priority.

Figure 6:
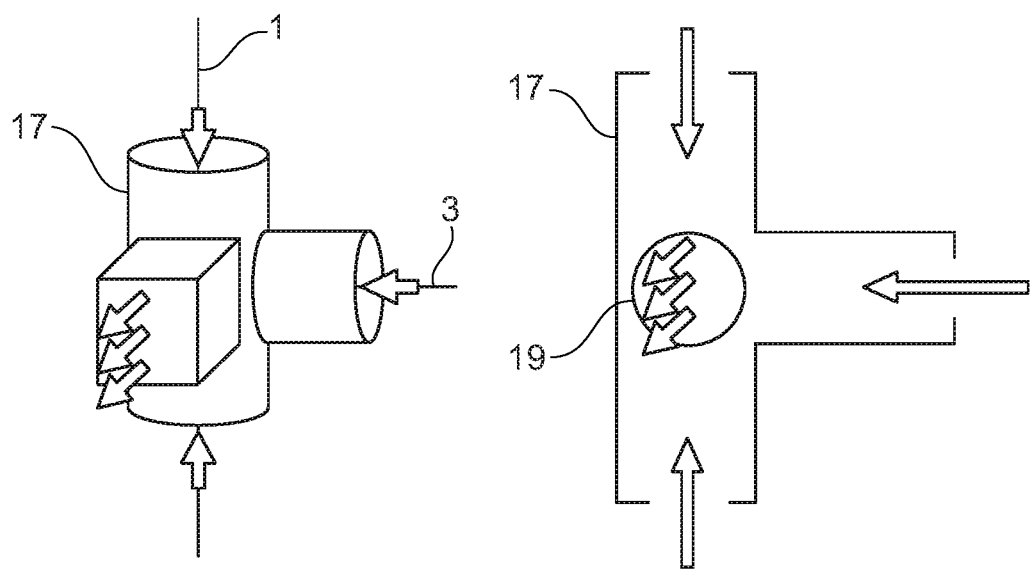
FIG. 6 shows at left a cooling junction where coolant flow paths for a bus bar and a cable meet at an electrical connection joint between the bus bar and the cable, and at right a flow map of the junction.

Matching coolant flows of components with lower mass flow requirements to coolant flows of components with higher mass flow requirements can be achieved by using appropriate area ratios at junctions, as illustrated in FIG. 6, which shows at left a cooling junction 17 where coolant flow paths (in the form of surrounding tubular jackets) for the bus bar 1 and one of the cables 3 meet at the electrical connection joint between the bus bar and the cable. Coolant flows into the junction along all these flow paths, and leaves the junction through an exit port 19 into an outflow line of a wider coolant circuit. A flow map of the junction is also shown schematically at right. Arrows indicate the direction and amount of coolant flow. Clearly, the flow leaving through the exit port is the combined flow of the flows entering the junction. By ensuring that at such junctions the directions of coolant flow along the bus bar and the cables are either all into the junction or all away from the junction, overall mass flows through the junction are increased so that cooling times are reduced, the higher likelihood of quenching at electrical connection joints is mitigated, and the junctions become more thermally robust.

Furthermore, when the junctions 17 are the final cooled components within a given cooling circuit (i.e. when the directions of coolant flow along the bus bar 1 and the cables 3 are all into the junction), any effect of fluctuations in temperature from upstream components (i.e. the bus bar or cables) on a coolant flow temperature can be diluted by combining with the other flows at the junction.

Figure 7:
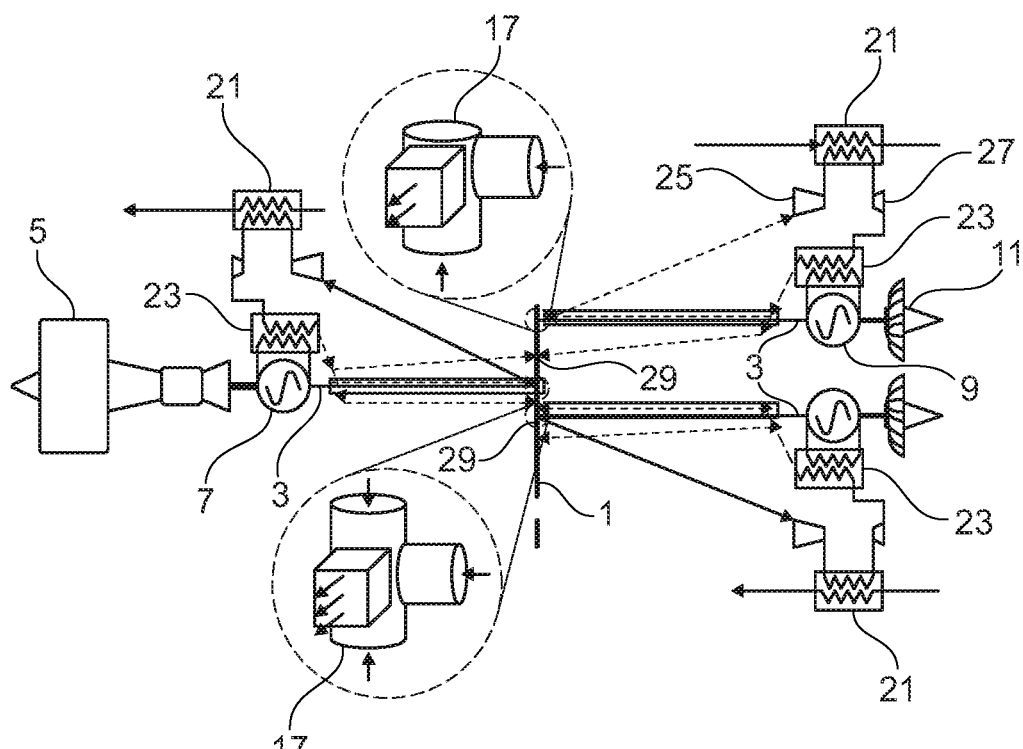
FIG. 7 shows schematically a part of the AC network of FIG. 1 comprising a cooling arrangement which includes cooling junctions at electrical connection joints between a bus bar and cables, and which takes account of cooling priority levels of components of the network.

FIG. 7 shows schematically a part of the AC network of FIG. 1 comprising a cooling arrangement which includes such cooling junctions 17 at the electrical connection joints between the bus bar 1 and the cables 3, and which takes account of cooling priority levels across the whole network. A first coolant system of the arrangement has first cooling circuits which include coolant flow paths (e.g. in the form of surrounding tubular jackets) along the bus bar 1 and the cables 3. More particularly, each first cooling circuit has a respective first heat exchanger 21 where the cryogenic coolant of the circuit, such a helium or hydrogen, is cooled by transfer of heat to a further coolant, such as LNG. Each first cooling circuit further has an inflow line which carries the first coolant from its first heat exchanger via an expander 27 and a second heat exchanger 23 (discussed in more detail below) to an end, distal from the bus bar, of the flow path of one of the cables 3. Each first cooling circuit also has an outflow line which removes the first coolant from one of the cooling junctions 17 and returns it to its heat exchanger 21 via a compressor 25. The direction of flow along the inflow lines and outflow lines is indicated in FIG. 7 with arrowed lines As well as the cooling junctions 17, the bus bar 1 also has further junctions 29 on the bus bar flow path between each pair of adjacent cooling junctions 17. Some or all of the first cooling circuits additionally then have further inflow lines which each carry the first coolant to the further junctions. In this way, the first coolant leaves each further junction by flow in opposite directions along the bus bar flow path to the adjacent cooling junctions 17.

The end cooling junctions 17 (i.e. as exemplified by the top junction shown in magnified view in FIG. 7) on the bus bar 1 have incoming flows along two flow paths, while the central cooling junctions 17 (i.e. as exemplified by the bottom junction shown in magnified view in FIG. 7) on the bus bar have incoming flows along three flow paths. However, the arrangement of cooling junctions 17, further junctions 29, inflow lines and outflow lines ensures that at each cooling junction 17 the directions of coolant flow along the bus bar 1 and the cables 3 are all into the junction, thereby maximising the coolant mass rate through the junction.

The power generators 7 and electrical motors 9 have high priority levels for cooing, and thus the network has a second coolant system in which second circuits circulate a second cryogenic coolant, such as helium or hydrogen, from one of the second heat exchangers 23 to one of the generators and motors and back to that second heat exchanger. In this way, heat rejected from each of the generators and motors is transferred into an inflow line of one of the first circuits before that inflow line reaches its respective cable 3. The high priority level of the generators and motors is thus respected by ensuring that they are supplied with the lowest temperature coolant of the entire cooling arrangement, while the high priority level of the cooling junctions 17 is respected by ensuring that they receive high mass flows of coolant. More generally, the matching of coolant mass flow and temperature with priority level helps to increase the robustness of the system. In addition, the number of heat exchangers, and hence overall weight and complexity, can be reduced relative to, for example, the arrangement of FIG. 3 with no drop in cooling performance.

Figure 8:
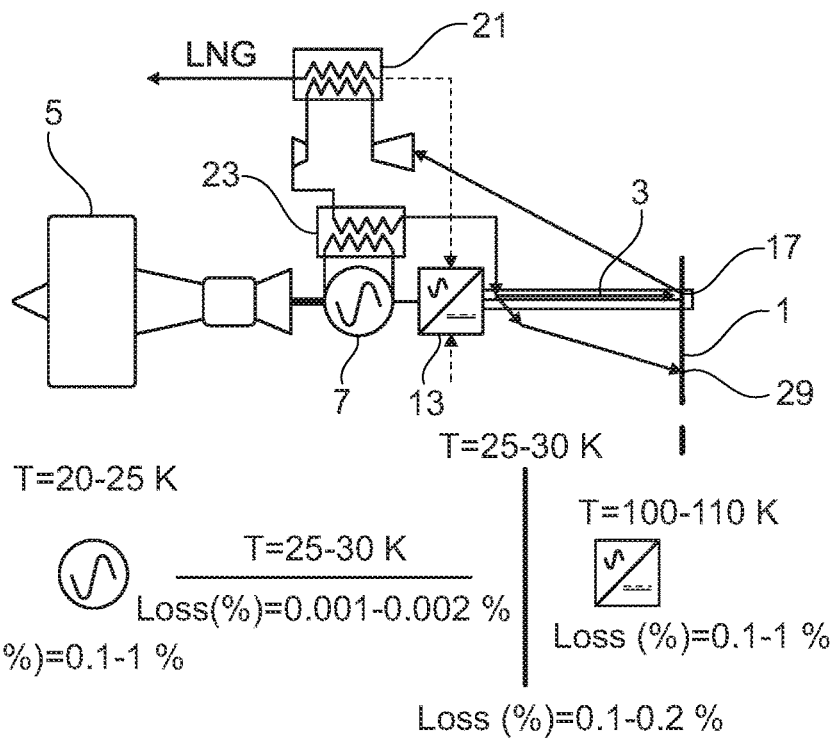
FIG. 8 shows schematically a part of the DC network of FIG. 2 comprising a cooling arrangement which is similar to that of FIG. 7, but also includes cooling for rectifiers and inverters of the network.

FIG. 8 shows schematically part of the DC network of FIG. 2 including a cooling arrangement which is essentially the same as that described above in relation to FIG. 7, except that to cool the rectifiers 13 and the inverters 15 (the latter not shown in FIG. 7) the LNG which receives heat from the first coolant in the first heat exchangers 21 is first used to cool the rectifiers and the inverters. Below the network schematic, the operational temperatures and losses of the components of the network are indicated.

Figure 9:
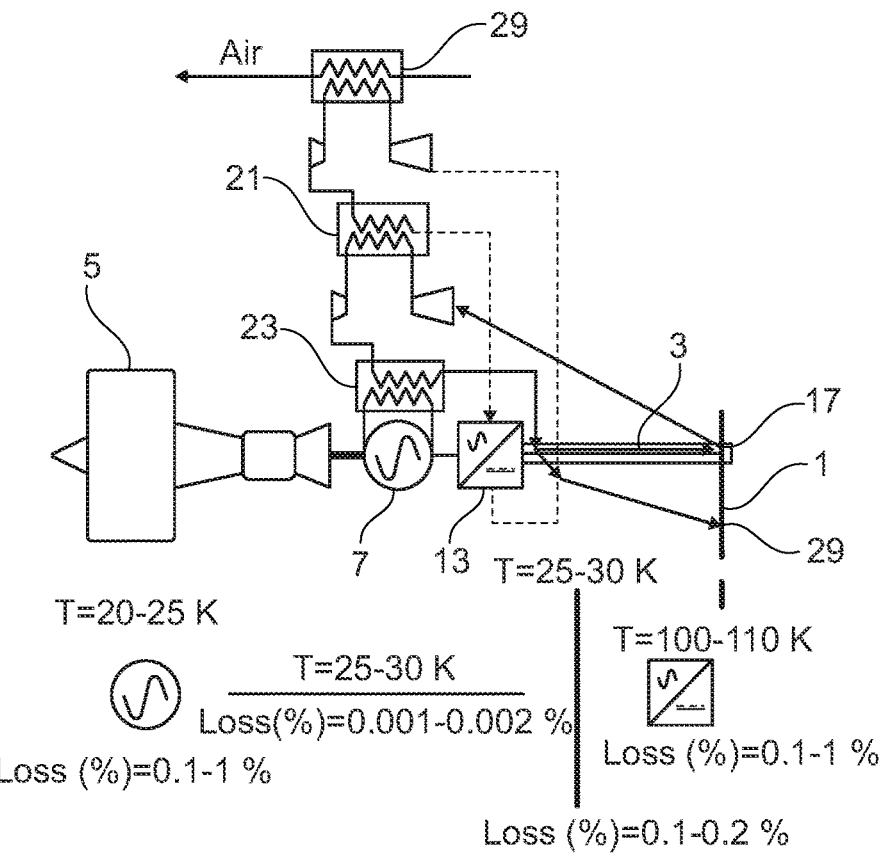
FIG. 9 shows schematically a variant of the network of FIG. 8.

FIG. 9 shows schematically a variant of the network of FIG. 8. In the variant, instead of using LNG to cool the rectifiers 13, inverters 15 and the first coolant in the first heat exchangers 21, a third coolant system is provided in which the heat rejected by the first coolant in the first heat exchangers is transferred into a third cryogenic coolant, which is circulated to third heat exchangers 29 where heat transfer is effected from the third coolant being into an air stream, e.g. derived from the air flow through the bypass duct of a turbofan aero-engine.

Figure 10:
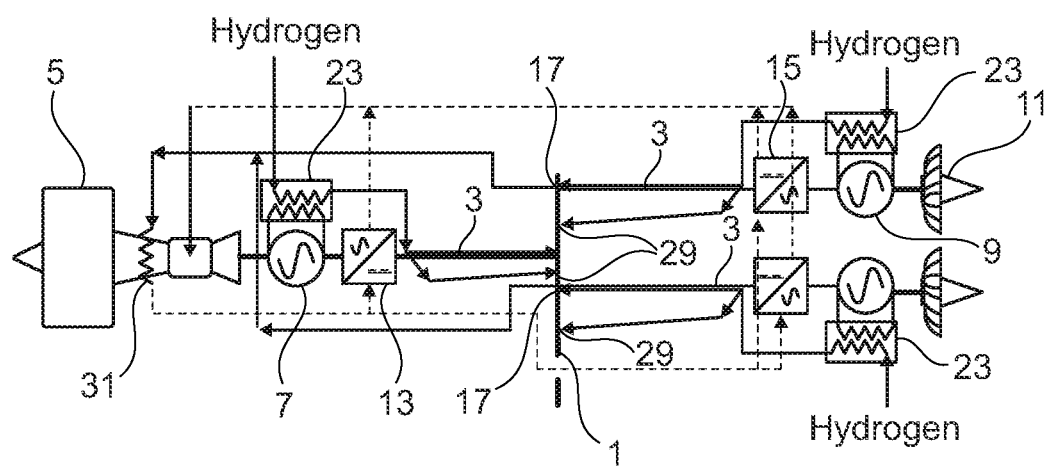
FIG. 10 shows schematically a further variant of the network of FIG. 8.
Figure 10:
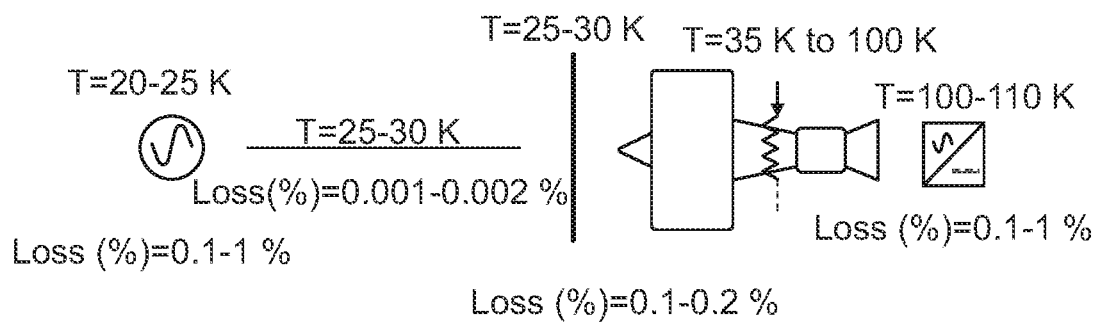

FIG. 10 shows schematically a further variant of the network of FIG. 8. In this variant the first coolant is hydrogen (e.g. liquid hydrogen, LH2). Moreover, the first coolant system, rather than circulating and re-cooling the hydrogen coolant in heat exchangers, draws the hydrogen from a reservoir, and after using the hydrogen for cooling sends it the gas turbines 5 as combustion fuel. In addition, the outflow lines of the first coolant system direct the hydrogen which has left the cooling junctions 17 firstly to intercoolers 31 of the gas turbines 5 for reducing the temperature of compressed air between compressor stages of the engines, and secondly to the rectifiers 13 and inverters 15 for cooling these components before onward flow to gas turbine combustors.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

I claim:

1. A superconducting electrical power distribution network comprising:
  a superconducting bus bar;
  superconducting cables electrically connected to the bus bar at respective joints distributed along the bus bar;

a first coolant system for providing first cryogenic fluid; and, first circuits for circulating the first cryogenic fluid provided by the first coolant system; wherein the first circuits comprise: a bus bar flow path which extends along and thereby cools the bus bar, cable flow paths which respectively extend along and thereby cool the cables, cooling junctions where the bus bar and cable flow paths meet at the electrical connection joints, inflow lines which send the first cryogenic fluid from the first coolant system to the flow paths, and outflow lines which remove the first cryogenic fluid from the flow paths; and each cooling junction is connected to a respective one of the outflow lines and is configured such that the first cryogenic fluid arrives at that cooling junction from the flow paths which meet thereat and departs that cooling junction into the respective outflow line for return to the first coolant system.

2. The superconducting electrical power distribution network as claimed in claim 1, wherein the first circuits further comprise a respective further junction on the bus bar flow path between the or each pair of adjacent cooling junctions, the or each further junction being connected to a respective one of the inflow lines and being configured such that the first cryogenic fluid arrives at that further junction from the respective inflow line and departs that further junction by flow in opposite directions along the bus bar flow path to the adjacent cooling junctions.

3. The superconducting electrical power distribution network as claimed in claim 1, wherein each cable flow path has an end which is distal from the bus bar flow path and which is connected to a respective one of the inflow lines.

4. The superconducting electrical power distribution network as claimed in claim 1, wherein the first cryogenic fluid is helium or hydrogen.

5. The superconducting electrical power distribution network as claimed in claim 1, wherein the first coolant system comprises one or more first heat exchange units for effecting heat transfer from the first cryogenic fluid to another fluid, the outflow lines returning the first cryogenic fluid removed from the flow paths back to the first heat exchange units for re-cooling and recirculation.

6. The superconducting electrical power distribution network as claimed in claim 1, comprising:
  (i) one or more superconducting electrical power generators, the or each power generator providing electrical power to the bus bar via a respective one of the cables; and/or
  (ii) one or more superconducting electrical motors, the or each motor receiving electrical power from the bus bar via a respective one of the cables; wherein,
  the superconducting electrical power distribution network further has:
  a second coolant system for cooling second cryogenic fluid; and
  one or more second circuits for circulating the second cryogenic fluid from the second coolant system, to (i) the power generators and/or (ii) the motors, and back to the second coolant system for re-cooling and recirculation; and
  the second coolant system comprises one or more second heat exchange units for effecting heat transfer from the second cryogenic fluid to the first cryogenic fluid.

7. The superconducting electrical power distribution network as claimed in claim 6, wherein the second cryogenic fluid is helium.

8. The superconducting electrical power distribution network as claimed in claim 6, comprising (i) the power generators, wherein:
  the power generators are AC power generators;
  the bus bar and cables carry DC electrical power;
  between the or each power generator and the cable via which its electrical power is provided to the bus bar, the power distribution network further has a respective semiconductor-based rectifier which rectifies the AC electrical power generated by the power generator into DC electrical power; and,
  the outflow lines provide the first cryogenic fluid removed from the flow paths to the or each rectifier for cooling thereby.

9. The superconducting electrical power distribution network as claimed in claim 6, comprising (i) the power generators, and further comprising one or more gas turbine engines which respectively power the one or more power generators, the or each gas turbine engine comprising a respective intercooler for reducing the temperature of compressed air between compressor stages of the engine, and the outflow lines providing the first cryogenic fluid removed from the flow paths to the or each intercooler for effecting heat transfer from the compressed air to the first cryogenic fluid.

10. The superconducting electrical power distribution network as claimed in claim 6, comprising (ii) the electrical motors, wherein:
  the electrical motors are AC electrical motors;
  the bus bar and cables carry DC electrical power; and
  between the or each electrical motor and the cable via which its electrical power is received from the bus bar, the power distribution network further has a respective semiconductor-based inverter which inverts the DC electrical power received from the bus bar into AC electrical power; and
  the outflow lines provide the first cryogenic fluid removed from the flow paths to the or each inverter for cooling thereby.

11. A superconducting electrical power distribution network comprising:
  a superconducting bus bar;
  superconducting cables electrically connected to the bus bar at respective joints distributed along the bus bar;
  a first coolant system for providing first cryogenic fluid; and
  first circuits for circulating the first cryogenic fluid provided by the first coolant system; wherein
  the first circuits comprise: a bus bar flow path which extends along and thereby cools the bus bar, cable flow paths which respectively extend along and thereby cool the cables, cooling junctions where the bus bar and cable flow paths meet at the electrical connection joints, inflow lines which send the first cryogenic fluid from the first coolant system to the flow paths, and outflow lines which remove the first cryogenic fluid from the flow paths; and
  each cooling junction is connected to a respective one of the inflow lines and is configured such that the first cryogenic fluid sent from the first coolant system arrives at that cooling junction from the respective inflow line and departs that cooling junction into the flow paths which meet thereat.

12. The superconducting electrical power distribution network as claimed in claim 11, wherein the first circuits further comprise a respective further junction on the bus bar flow path between the or each pair of adjacent cooling junctions, the or each further junction being connected to a respective one of the outflow lines and being configured such that the first cryogenic fluid arrives at that further junction by flow in opposite directions along the bus bar flow path from the adjacent cooling junctions and departs that further junction into the respective outflow line.

13. The superconducting electrical power distribution network as claimed in claim 11, wherein each cable flow path has an end which is distal from the bus bar flow path and which is connected to a respective one of the outflow lines.

* * * * *